United States Patent
Wang et al.

(10) Patent No.: US 12,260,999 B2
(45) Date of Patent: Mar. 25, 2025

(54) LEAD-FREE PHOTODETECTOR AND METHOD FOR MANUFACTURING THE SAME

(71) Applicants: CHUNGANG UNIVERSITY INDUSTRY ACADEMIC COOPERATION FOUNDATION, Seoul (KR); RESEARCH & BUSINESS FOUNDATION SUNGKYUNKWAN UNIVERSITY, Suwon-si (KR)

(72) Inventors: Dong Hwan Wang, Seoul (KR); Woong Sik Jang, Seoul (KR); Il Jeon, Suwon-si (KR); Kyu Sun Kim, Suwon-si (KR)

(73) Assignees: CHUNGANG UNIVERSITY INDUSTRY ACADEMIC COOPERATION FOUNDATION, Seoul (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 69 days.

(21) Appl. No.: 18/334,529

(22) Filed: Jun. 14, 2023

(65) Prior Publication Data

US 2024/0153714 A1 May 9, 2024

(30) Foreign Application Priority Data

Nov. 3, 2022 (KR) ........................ 10-2022-0145062

(51) Int. Cl.
*H10K 85/50* (2023.01)
*H01G 9/00* (2006.01)
(Continued)

(52) U.S. Cl.
CPC ......... *H01G 9/2009* (2013.01); *H01G 9/0036* (2013.01); *H10K 85/50* (2023.02);
(Continued)

(58) Field of Classification Search
CPC ...... H01L 31/00–078; Y02E 10/50–60; H10K 30/00–89; H10F 10/00–19; H10F 19/00–908
(Continued)

(56) References Cited

U.S. PATENT DOCUMENTS

2017/0025622 A1\* 1/2017 Gong ................. H10K 85/1135
2018/0247769 A1\* 8/2018 Qi .......................... H10K 85/50
(Continued)

FOREIGN PATENT DOCUMENTS

CN 103346262 A \* 10/2013

OTHER PUBLICATIONS

CN-103346262-A English (Year: 2013).\*
(Continued)

*Primary Examiner* — Bach T Dinh
(74) *Attorney, Agent, or Firm* — NSIP Law

(57) ABSTRACT

Disclosed are a lead-free photodetector and a method for manufacturing the same. The lead-free photodetector includes a light-side electrode, a light-side conductive layer formed on the light-side electrode, a perovskite layer formed on the light-side conductive layer, a rear-side conductive layer formed on the perovskite layer, and a rear-side electrode formed on the rear-side conductive layer.

11 Claims, 7 Drawing Sheets

(51) Int. Cl.
*H01G 9/20* (2006.01)
*H10K 85/10* (2023.01)
*H10K 85/20* (2023.01)
*H10K 85/60* (2023.01)

(52) U.S. Cl.
CPC ........ *H10K 85/111* (2023.02); *H10K 85/1135* (2023.02); *H10K 85/211* (2023.02); *H10K 85/215* (2023.02); *H10K 85/6572* (2023.02)

(58) Field of Classification Search
USPC ............................................... 136/243–265
See application file for complete search history.

(56) References Cited

U.S. PATENT DOCUMENTS

2019/0362905 A1* 11/2019 Kusumoto ............. H10K 71/12
2020/0274077 A1*  8/2020 Ujiie .................... C07D 495/04
2021/0376274 A1* 12/2021 Furukawa ............ H10K 85/113

OTHER PUBLICATIONS

Cao, Fengren, et al., "Progress of Lead-Free Halide Perovskites: From Material Synthesis to Photodetector Application." Advanced Functional Materials 31.11 (2021): 2008275., (15 pages).
Kapil, Gaurav, et al. "Tin-lead Perovskite Fabricated via Ethylenediamine Interlayer Guides to the Solar Cell Efficiency of 21.74%." Advanced Energy Materials 11.25 (2021): 2101069., (9 pages).
Korean Office Action issued on Jul. 17, 2024, in counterpart Korean Patent Application No. 10-2022-0145062 (6 pages in English, 6 pages in Korean).

* cited by examiner

LEAD-FREE PHOTODETECTOR AND METHOD FOR MANUFACTURING THE SAME

CROSS-REFERENCE TO RELATED APPLICATION

This application claims a benefit under 35 U.S.C. § 119(a) of Korean Patent Application No. 10-2022-0145062 filed on Nov. 3, 2022, on the Korean Intellectual Property Office, the entire disclosure of which is incorporated herein by reference for all purposes.

BACKGROUND

1. Field

The present disclosure relates to a lead-free photodetector and a method for manufacturing the same.

2. Description of Related Art

A photodetector containing perovskite is being studied for advantages thereof such as excellent photosensitivity, wide light absorption range, and the like of a perovskite material, which is a photoreactive layer. Therefore, an attempt to increase a performance by introducing a perovskite photosensitive layer with an effective composition is in progress.

A conventional photodetector uses a lead-containing perovskite material. As lead is selected as an environmentally harmful substance, a limited research and development is being conducted. The lead-containing perovskite material not only causes environmental problems, but also exhibits a limited light absorption range that is sensitive only to a visible light spectrum and causes noise generation resulted from an increase in a grain size. Therefore, a development of a photodetector containing lead-free perovskite is required.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

A purpose of the present disclosure is to provide a lead-free photodetector to which lead-free perovskite is applied.

Another purpose of the present disclosure is to provide a method for manufacturing a lead-free photodetector.

Purposes in accordance with the present disclosure are not limited to the above-mentioned purpose. Other purposes and advantages in accordance with the present disclosure as not mentioned above may be understood from following descriptions and more clearly understood from embodiments in accordance with the present disclosure. Further, it will be readily appreciated that the purposes and advantages in accordance with the present disclosure may be realized by features and combinations thereof as disclosed in the claims.

A first aspect of the present disclosure provides a lead-free photodetector comprising: a light-side electrode; a light-side conductive layer formed on the light-side electrode; a perovskite layer formed on the light-side conductive layer; a rear-side conductive layer formed on the perovskite layer; and a rear-side electrode formed on the rear-side conductive layer.

In one implementation of the first aspect, the perovskite layer contains $PEA_xFA_{1-x}SnI_3$.

In one implementation of the first aspect, PEA is phenethylammonium.

In one implementation of the first aspect, FA is formamidinium.

In one implementation of the first aspect, the x is a positive real number equal to or smaller than 1.

In one implementation of the first aspect, the x is between 0.1 to 0.2.

In one implementation of the first aspect, the light-side electrode contains indium tin oxide (ITO).

In one implementation of the first aspect, the light-side conductive layer contains PEDOT:PSS (poly(3,4-ethylenedioxythiophene):poly(styrenesulfonate)).

In one implementation of the first aspect, the rear-side conductive layer contains EDA (ethylenediamine), $PC_{61}BM$ ([6,6]-phenyl-$C_{61}$-butyric acid methyl ester), $C_{60}$ (fullerene), and BCP (bathocuproine).

In one implementation of the first aspect, the rear-side electrode contains silver (Ag).

In one implementation of the first aspect, the lead-free photodetector has a dark current density in a range from 626 to 766 $nA/cm^2$ under an applied voltage of −0.1 V.

In one implementation of the first aspect, the lead-free photodetector has a signal-to-noise ratio (SNR) in a range from 46 to 56 dB.

A second aspect of the present disclosure provides a method for manufacturing a lead-free photodetector, the method comprising: a first step of disposing a light-side conductive layer on a light-side electrode; a second step of disposing a perovskite layer on the light-side conductive layer; a third step of disposing a rear-side conductive layer on the perovskite layer; and a fourth step of disposing a rear-side electrode on the rear-side conductive layer.

In one implementation of the second aspect, the perovskite layer contains $PEA_xFA_{1-x}SnI_3$.

In one implementation of the second aspect, PEA is phenethylammonium.

In one implementation of the second aspect, FA is formamidinium.

In one implementation of the second aspect, the x is a positive real number equal to or smaller than 1.

In one implementation of the second aspect, the x is between 0.1 to 0.2.

In one implementation of the second aspect, the light-side electrode contains indium tin oxide (ITO).

In one implementation of the second aspect, the light-side conductive layer contains PEDOT:PSS.

In one implementation of the second aspect, the rear-side conductive layer contains EDA, $PC_{61}BM$, $C_{60}$, and BCP.

In one implementation of the second aspect, the third step is performed by disposing a layer containing the EDA on the perovskite layer, disposing a layer containing the $PC_{61}BM$ on the layer containing the EDA, disposing a layer containing the $C_{60}$ on the layer containing the $PC_{61}BM$, and disposing a layer containing the BCP on the layer containing the $C_{60}$.

In one implementation of the second aspect, the rear-side electrode contains silver (Ag).

In one implementation of the second aspect, the lead-free photodetector manufactured by the method for manufacturing the lead-free photodetector has a dark current density in a range from 626 to 766 nA/cm$^2$ under an applied voltage of −0.1 V.

In one implementation of the second aspect, the lead-free photodetector manufactured by the method for manufacturing the lead-free photodetector has a signal-to-noise ratio in a range from 46 to 56 dB.

A lead-free photodetector according to the embodiment of the present disclosure has the low dark current density and the improved signal-to-noise ratio.

The method for manufacturing the lead-free photodetector according to the embodiment of the present disclosure may be used to manufacture the lead-free photodetector having the low dark current density and the improved signal-to-noise ratio.

In addition to the effects as described above, specific effects in accordance with the present disclosure will be described together with the detailed description for carrying out the disclosure.

DETAILED DESCRIPTIONS

Figure 1:
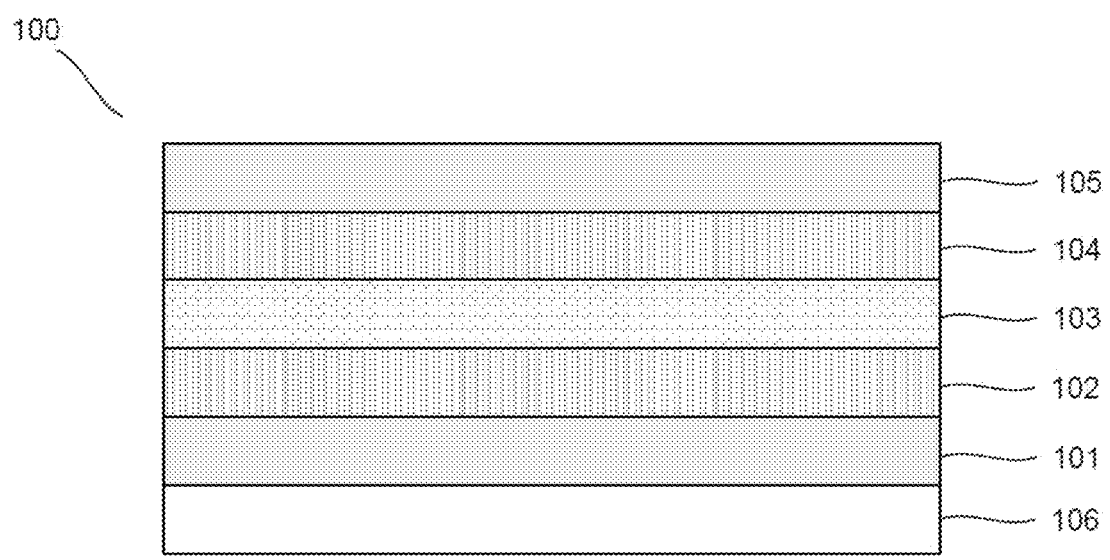
FIG. 1 is a side view schematically illustrating a lead-free photodetector according to an embodiment of the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating embodiments of the present disclosure are illustrative, and the present disclosure may not be limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may be actually executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated.

The features of the various embodiments of the present disclosure may be partially or entirely combined with each other, and may be technically associated with each other or operate with each other. The embodiments may be implemented independently of each other and may be implemented together in an association relationship.

FIG. 1 is a side view schematically illustrating a lead-free photodetector according to an embodiment of the present disclosure.

Referring to FIG. 1, a lead-free photodetector 100 according to an embodiment of the present disclosure may include a light-side electrode 101; a light-side conductive layer 102 formed on the light-side electrode 101; a perovskite layer 103 formed on the light-side conductive layer 102; a rear-side conductive layer 104 formed on the perovskite layer 103; and a rear-side electrode 105 formed on the rear-side conductive layer 104.

The light-side electrode 101 and the rear-side electrode 105 are conductive members capable of providing input and output of a conductive path of an element. Herein, a 'light-side' means a side on which light is incident and/or on which light is intended to be incident when the element or the like changes in physical, chemical, and/or electrical properties with respect to the incident light. To realize the above-described function, a light-side member may have transparency and/or translucency such that light and/or light of an intended wavelength may be incident thereto and transmitted therethrough at a significant level. In addition, herein, a 'rear-side' means a side opposite to the light-side, but it is not necessarily excluded that the 'rear-side' may also have properties that the 'light-side' has. In one embodiment, the light-side electrode 101 and the rear-side electrode 105 may have the transparency and opacity, respectively. In another embodiment, both the light-side electrode 101 and the rear-side electrode 105 may have the transparency and/or the translucency. Materials and structures of the light-side electrode 101 and the rear-side electrode 105 are not particularly limited as long as the above functions are performed. In one embodiment, the light-side electrode 101 may contain indium tin oxide (ITO). In one embodiment, the rear-side electrode 105 may contain silver (Ag).

The light-side conductive layer 102 and the rear-side conductive layer 104 are members capable of providing the conductive path between electrodes and/or between an electrode and another member. Herein, 'conductivity' means a property in which electrical conduction is realized, and the 'conductive path' means a path in which the conductivity is realized. The electrical conduction should be understood in a comprehensive sense that does not exclude any phenomenon known in the art, such as transport of charges, ions, holes, and the like. In one example, as long as the above functions are performed, materials and structures of the light-side conductive layer 102 and the rear-side conductive layer 104 are not particularly limited. In one embodiment, the light-side conductive layer 102 may contain PEDOT:PSS (Poly(3,4-ethylenedioxythiophene):poly(styrenesulfonate)). In one embodiment, the rear-side conductive layer 104 may contain EDA (ethylenediamine), $PC_{61}BM$ ([6,6]-phenyl-$C_{61}$-butyric acid methyl ester), $C_{60}$ (fullerene), and BCP (bathocuproine).

The perovskite layer refers to a layer containing a perovskite material. Herein, perovskite refers collectively to materials having a crystal structure of $ABX_3$. In one embodiment, the perovskite layer may contain one or more perovskite materials. In one embodiment, the perovskite layer may contain a lead-free perovskite material. In one embodiment, the perovskite layer may contain a tin-based perovskite material. In one embodiment, the perovskite layer 103 may contain $PEA_xFA_{1-x}SnI_3$. Here, the PEA may be phenethylammonium. Here, the FA may be formamidinium. Here, the x may be a positive real number equal to or smaller than 1.

As the x in the $PEA_xFA_{1-x}SnI_3$ is determined as the positive real number equal to or smaller than 1, a total amount of PEA and FA may be approximately equal to an amount of Sn, thereby completing a perovskite structure. Therefore, the perovskite structure may be implemented even when a magnitude of the x is not particularly limited. In one embodiment, the x may be between about 0.1 and 0.2. The present disclosure is based on manufacture of a photodetector containing the lead-free perovskite, for example, the tin-based perovskite, e.g., $PEA_xFA_{1-x}SnI_3$, in the perovskite layer and/or finding of an improved effect thereof.

The lead-free photodetector 100 according to an embodiment of the present disclosure does not exclude addition of other additional and optional members. In one embodiment, the lead-free photodetector 100 according to an embodiment of the present disclosure may include a substrate 106 on which the light-side electrode 101 may be formed.

The photodetector according to the above-described aspect and the embodiment uses the lead-free perovskite, so that there are few environmental problems and a wide light absorption range is achieved. In addition, the present disclosure is based on a fact that the photodetector according to the above-described aspect and the embodiment has also been improved in a performance as a photodetector. In one embodiment, the lead-free photodetector may have a dark current density in a range from about 626 to 766 $nA/cm^2$ under an applied voltage of about −0.1 V. In one embodiment, the lead-free photodetector may have a signal-to-noise ratio (SNR) in a range from about 46 to 56 dB. The scope of the photodetector according to an embodiment of the present disclosure is not limited to the above effects, but the above-described effects will become apparent via following Experimental Example.

Figure 2:
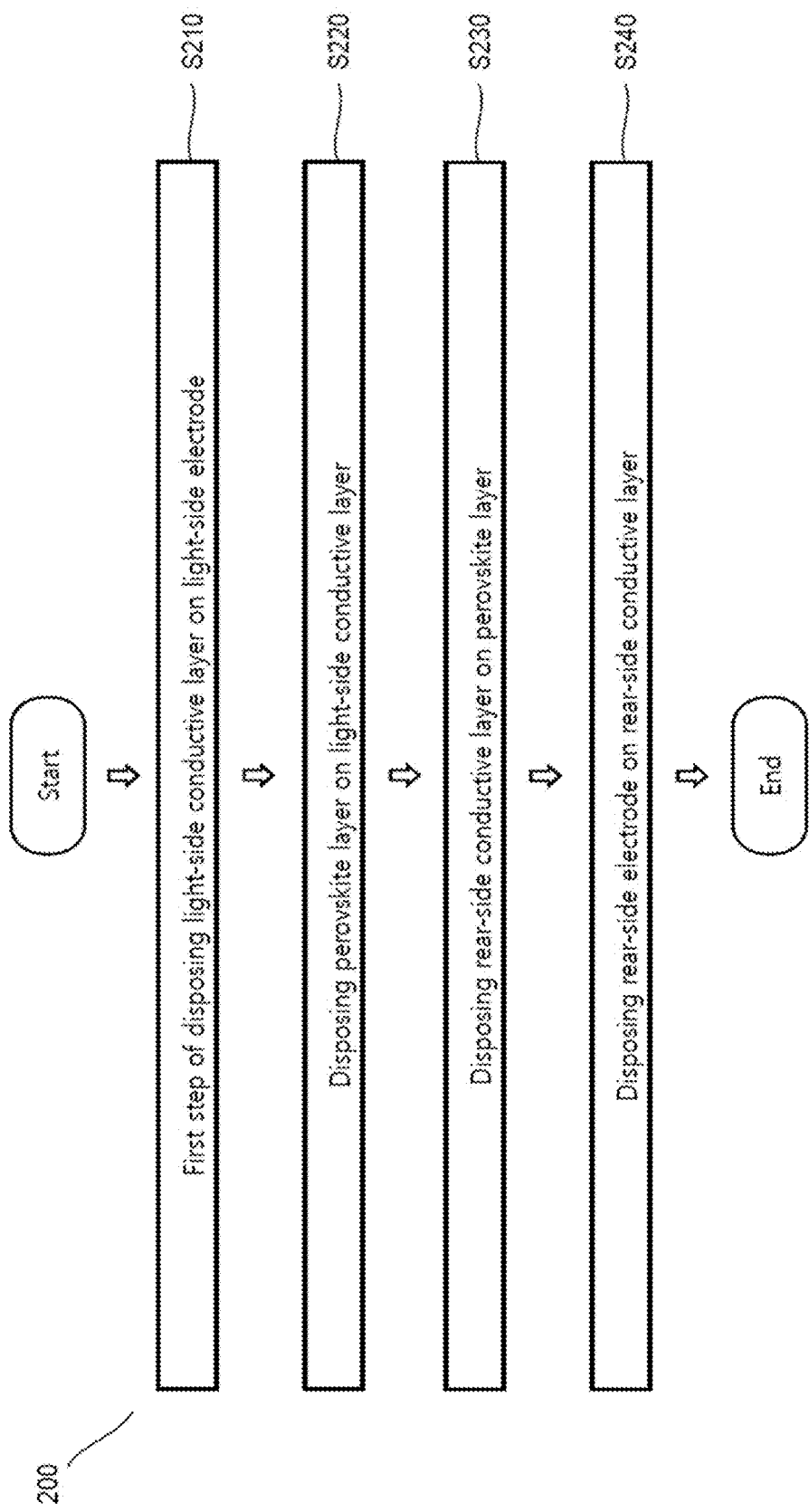
FIG. 2 is a flowchart illustrating a method for manufacturing a lead-free photodetector according to an embodiment of the present disclosure.

FIG. 2 is a flowchart illustrating a method for manufacturing a lead-free photodetector according to an embodiment of the present disclosure.

Referring to FIG. 2, a method for manufacturing a lead-free photodetector according to an embodiment of the present disclosure may include a first step (S210) of disposing the light-side conductive layer on the light-side electrode; a second step (S220) of disposing the perovskite layer on the light-side conductive layer; a third step (S230) of disposing the rear-side conductive layer on the perovskite layer; and a fourth step (S240) of disposing the rear-side electrode on the rear-side conductive layer.

The description of the method for manufacturing the lead-free photodetector according to an embodiment of the present disclosure may be applied in the same or similar manner to the same or similar components in the description of the lead-free photodetector according to an embodiment of the present disclosure.

The first step (S210), the second step (S220), the third step (S230), and the fourth step (S240) are steps of depositing the light-side electrode, the light-side conductive layer, the perovskite layer, the rear-side conductive layer, and the rear-side electrode, respectively. The descriptions of the light-side electrode, the light-side conductive layer, the perovskite layer, the rear-side conductive layer, and the rear-side electrode may be applied in the same or similar manner as the description of the lead-free photodetector according to an embodiment of the present disclosure described above.

Thus, in one embodiment, the perovskite layer may contain the one or more perovskite materials. In one embodiment, the perovskite layer may contain the lead-free perovskite material. In one embodiment, the perovskite layer may contain the tin-based perovskite material. In one embodiment, the perovskite layer may contain the PEA$_x$FA$_{1-x}$SnI$_3$. Here, the PEA may be the phenethylammonium. Here, the FA may be the formamidinium. Here, the x may be the positive real number equal to or smaller than 1. In one embodiment, the x may be between about 0.1 and 0.2. In one embodiment, the light-side electrode may contain the indium tin oxide. In one embodiment, the light-side conductive layer may contain the PEDOT:PSS. In one embodiment, the rear-side conductive layer may contain the EDA, the PC$_{61}$BM, the C$_{60}$, and the BCP. In one embodiment, the rear-side electrode may contain the silver (Ag).

In one example, in one embodiment, the third step (S230) may be performed by disposing a layer containing the EDA on the perovskite layer, disposing a layer containing the PC$_{61}$BM on the layer containing the EDA, disposing a layer containing the C$_{60}$ on the layer containing the PC$_{61}$BM, and disposing a layer containing the BCP on the layer containing the C$_{60}$.

In one example, in the method for manufacturing the lead-free photodetector according to an embodiment of the present disclosure, a method for disposing each layer is not particularly limited. Non-limiting examples of the method for disposing each layer may include deposition and spin-coating, and the method for disposing each layer may be independently selected. Further, the method for manufacturing the lead-free photodetector according to an embodiment of the present disclosure does not preclude addition of additional, illustrative, or dependent steps. For example, the light-side electrode may be disposed on the substrate. For example, the light-side electrode may be treated with UVO. For example, the light-side conductive layer may be disposed via the spin-coating. For example, the perovskite layer may be disposed via the spin-coating. For example, the perovskite layer may be subjected to heat treatment after being disposed. For example, the perovskite layer may be subjected to the heat treatment two or more times after being disposed. For example, the layer containing the EDA may be disposed via the spin-coating. For example, the layer containing the PC$_{61}$BM may be disposed via the spin-coating. For example, the layer containing C$_{60}$ may be disposed via the deposition. For example, the layer containing the BCP may be disposed via the deposition.

In one example, via the method for manufacturing the lead-free photodetector according to an embodiment of the present disclosure, the lead-free photodetector according to an embodiment of the present disclosure may be manufactured, and the lead-free photodetector manufactured via the method may have the same or similar level of performance as the lead-free photodetector according to an embodiment of the present disclosure described above. In one embodiment, the lead-free photodetector manufactured by the method for manufacturing the lead-free photodetector may have a dark current density in the range from about 626 to 766 nA/cm$^2$ under the applied voltage of about −0.1 V. In one embodiment, the lead-free photodetector manufactured by the method for manufacturing the lead-free photodetector may have the signal-to-noise ratio (SNR) in the range from about 46 to 56 dB.

Hereinafter, Examples of the present disclosure will be described in detail. However, Examples described below are merely some embodiments of the present disclosure, and the scope of the present disclosure is not limited to Examples below.

Manufacturing Example

A glass substrate is prepared. A UVO-treated ITO is disposed on the glass substrate. The conductive layer is formed by spin-coating PEDOT:PSS solution onto the ITO. Perovskite solution is spin-coated onto the PEDOT:PSS conductive layer to form the perovskite layer. Lead-based (Comparative Example) and non-lead-based PEA$_{0.15}$FA$_{0.85}$SnI$_3$ (Example) were prepared as the perovskite solution. The perovskite layer is heat treated at 65° C. for 10 minutes and then at 100° C. for 100 minutes. EDA solution is spin-coated onto the perovskite layer, then PC$_{61}$BM solution is spin-coated onto the EDA layer, then the C$_{60}$ is deposited onto the PC$_{61}$BM layer, and then the BCP is deposited onto the C$_{60}$ layer to form the conductive layer. Finally, a silver (Ag) electrode is deposited on the conductive layer.

Experimental Example

Photodetector Structure

Figure 3:
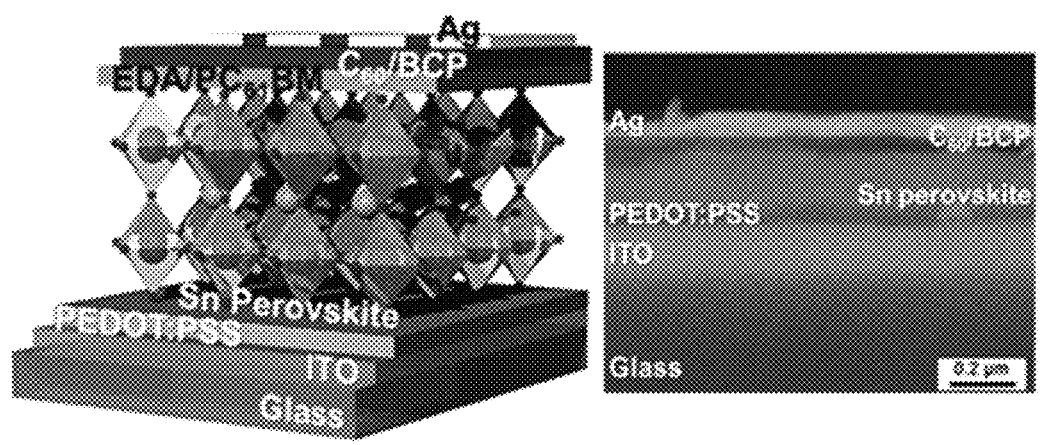
FIGS. 3 to 7 are diagrams illustrating experimental results according to Experimental Example of the present disclosure.

A left view of FIG. 3 is a view showing a structure of the lead-free photodetector according to Example of the present disclosure, and a right view of FIG. 3 is a photograph of a cross-sectional image. Referring to FIG. 3, it may be seen that a layered structure in an order of the substrate-the ITO-the PEDOT:PSS-the perovskite-the conductive layer-the Ag electrode was manufactured.

Photodetector Principle

Figure 4:
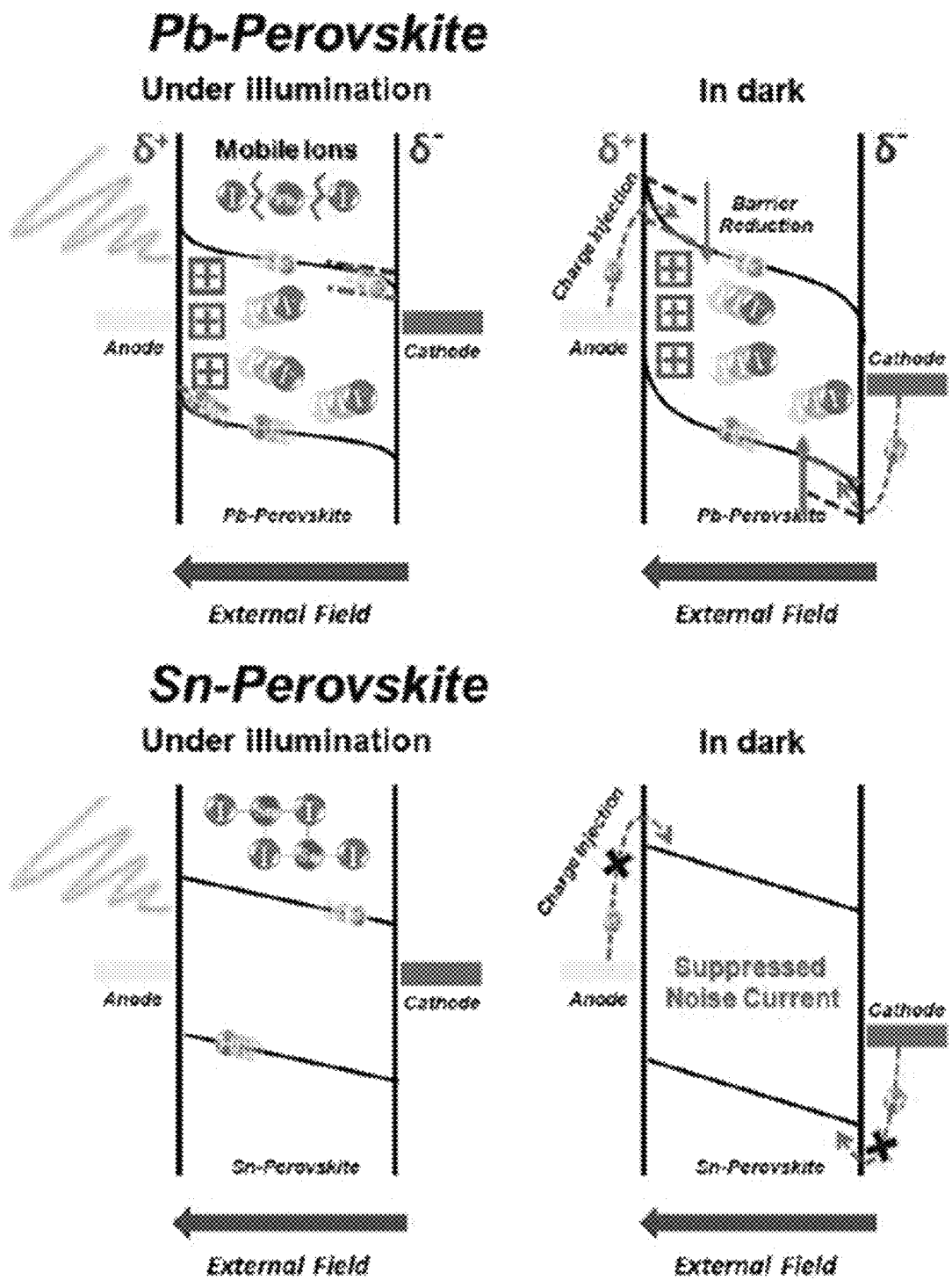

FIG. 4 is a view illustrating photocurrent generation and suppression of dark current in driving mechanism of the lead-based perovskite photodetector (upper view) and the lead-free perovskite photodetector (lower view). In metal-halogen perovskite, halogen ions are free to migrate. Mobile ions in the perovskite accumulate at an interface when a certain voltage is applied to the material, thereby lowering a barrier energy that inhibits collection of charge carriers generated by light. The mobile ions also amplify the dark current by ion screening, which reduces the performance of the photodetector.

Analysis of Dark Current and Photodetection Ability

Figure 5:
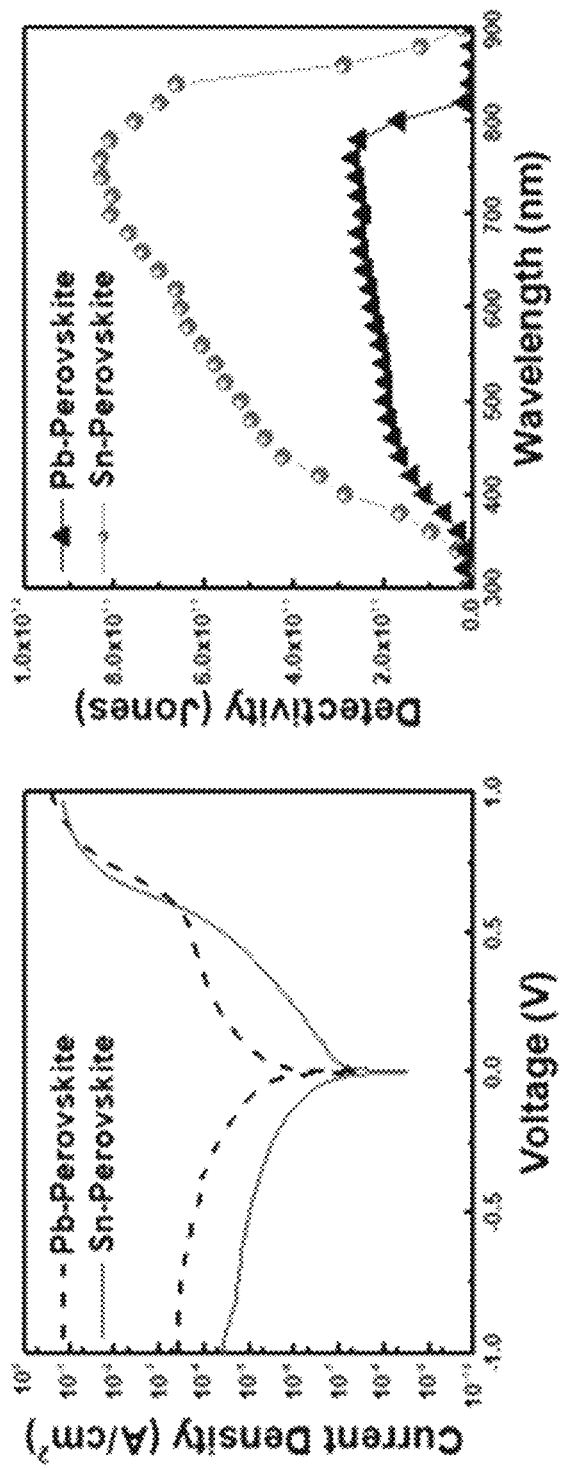

FIG. 5 is a view illustrating dark currents (left view) and photodetection abilities (right view) of the photodetectors to which the lead-based perovskite (black) and the lead-free perovskite (red) are applied. Referring to left view of FIG. 5, it may be seen that the dark currents of the lead-based perovskite and the lead-free perovskite under the applied voltage of −0.1 V are 1.11×10$^{-5}$ and 6.96×10$^{-7}$ A/cm$^2$, respectively. In addition, under the same conditions, referring to right view of FIG. 5, it may be seen that the photodetection abilities of the lead-based perovskite and the lead-free perovskite are 2.68×10$^{11}$ and 8.29×10$^{11}$ Jones based on 760 nm, respectively.

Internal Potential Barrier Analysis

Figure 6:
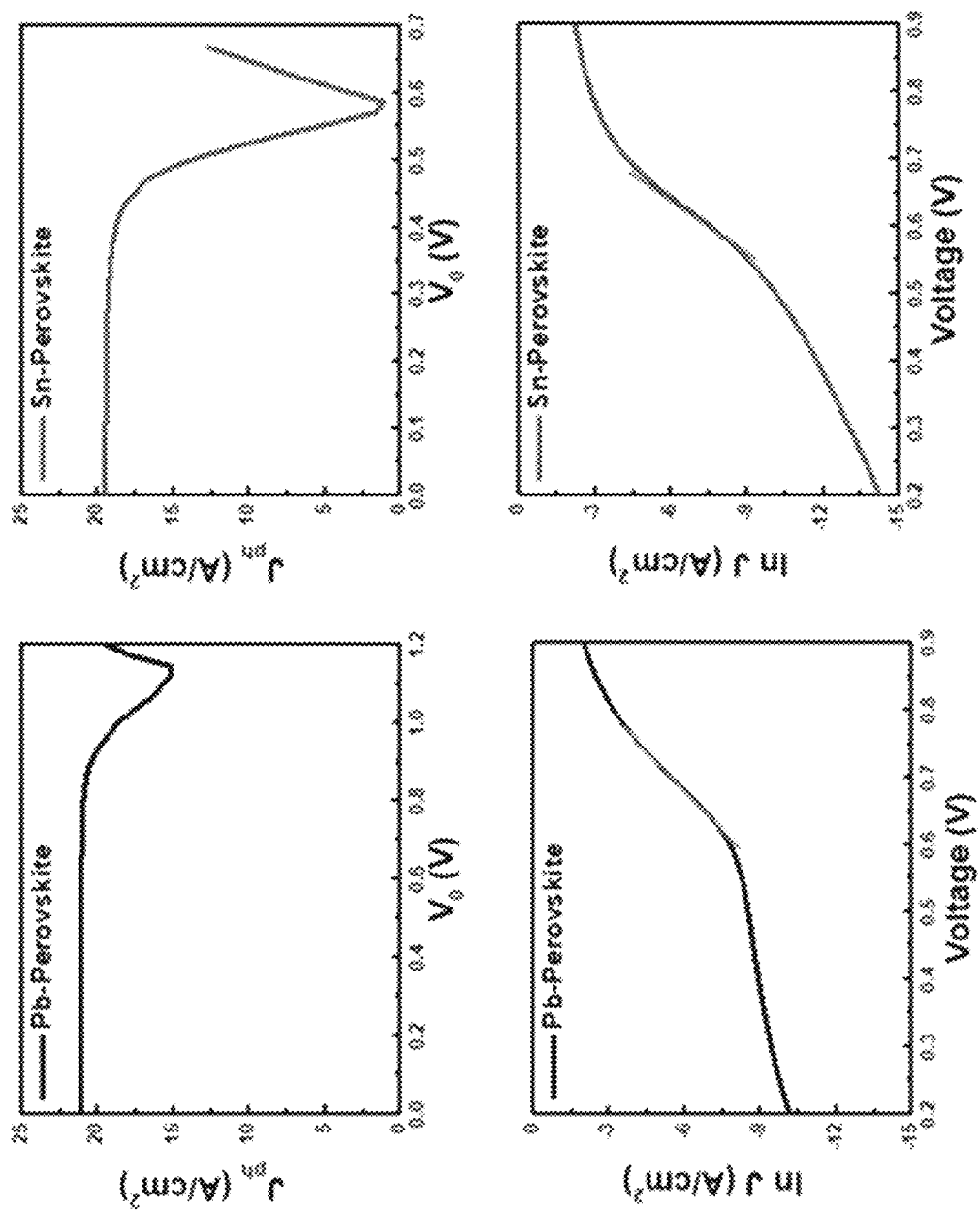

FIG. 6 is a view (J-V) showing photocurrent-based internal potential barriers (upper left view and upper right view) and dark current-based internal potential barriers (lower left view and lower right view) of the photodetectors to which the lead-based perovskite (black) and the lead-free perovskite (red) are applied. Upper left view and upper right view of FIG. 6 are views illustrating photocurrent densities of the respective perovskite photodetectors. Here, a compensation voltage (V$_0$) is calculated as follows.

$$V_0 = V_{bi} - \frac{kT}{q_e} \ln(A)$$

Here, V$_{bi}$ is an internal potential barrier under light irradiation, k is a Boltzmann constant, and T is a temperature. It may be seen that, in the lead-based perovskite and the lead-free perovskite, $V_0$ is 1.14 and 0.59 V, respectively. Lower left view and lower right view in FIG. 6 are views (In J-V) illustrating photocurrent densities of the respective perovskite photodetectors. A plot exhibits three sections: an ohmic section, a trap-filling section, and a space charge limited current (SCLC) section. It may be seen that, in the SCLC section, the Vbi of the lead-based perovskite and the lead-free perovskite are 0.74 and 0.71 V, respectively.

Performance Analysis

Figure 7:
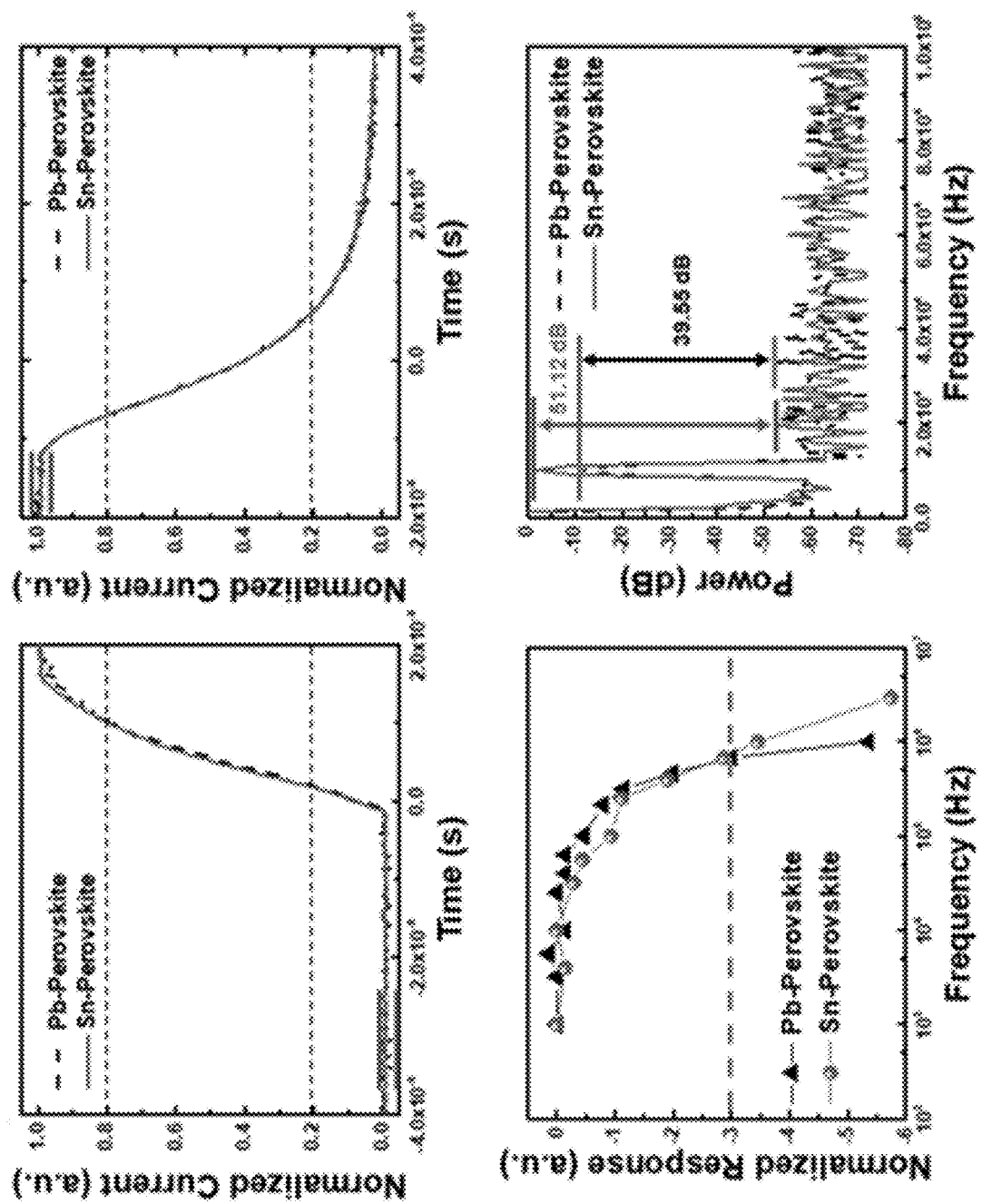

FIG. 7 is a view showing light response rates (upper left view and upper right view), light response critical frequencies (lower left view), and signal-to-noise ratios (lower right view) of the photodetectors to which the lead-based perovskite (black) and the lead-free perovskite (red) are applied. Upper left view and upper right view in FIG. 7 show photoresponses of the perovskite photodetectors when irradiated with a 452 nm LED having a power density of 1182 μW/cm$^2$. In the case of lead-free photodetector, a rise time and a fall time are 0.78 and 1.31 μs, respectively. On the other hand, it may be seen that the lead-based photodetector has a rise time and a fall time of 0.83 and 1.33 μs, respectively, which indicates that the photoresponse is slower. Response for frequencies ranging from 1 kHz to 5 MHz were analyzed under light pulses ranging from 745 to 1182 μW/cm$^2$ (FIG. 7, lower left view). A $f_{-3\ dB}$ value at which a signal is reduced by 50% relative to an initial signal is used as an evaluation index. For the lead-free photodetector, the $f_{-3\ dB}$ value was measured to be 763 kHz, which is higher than the $f_{-3\ dB}$ value of 631 kHz for the lead-based photodetector. In addition, referring to lower right view of FIG. 7, the signal-to-noise ratio was 39.55 dB for the lead-based photodetector, whereas the signal-to-noise ratio was 51.12 dB for the non-lead photodetector, which is higher.

Although the present disclosure has been described with reference to the embodiment of the present disclosure, the technical idea of the present disclosure is not limited to the above embodiment. The method and the device for analyzing the mode change of each of the unidirectional composite material may be modified in various manner within the scope not departing from the technical idea of the present disclosure.

What is claimed is:

1. A lead-free photodetector comprising:
    a light-side electrode;
    a light-side conductive layer formed on the light-side electrode;
    a perovskite layer formed on the light-side conductive layer;
    a rear-side conductive layer formed on the perovskite layer; and
    a rear-side electrode formed on the rear-side conductive layer,
    wherein the perovskite layer contains $PEA_xFA_{1-x}SnI_3$:
    where PEA is phenethylammonium, FA is formamidinium, and the x is a positive real number equal to or smaller than 1, and
    wherein the rear-side conductive layer comprises EDA (ethylenediamine), $PC_{61}BM$ ([6,6]-phenyl-$C_{61}$-butyric acid methyl ester), $C_{60}$ (fullerene), and BCP (bathocuproine).

2. The lead-free photodetector of claim 1, wherein the x is between 0.1 to 0.2.

3. The lead-free photodetector of claim 1, wherein the light-side electrode comprises indium tin oxide (ITO).

4. The lead-free photodetector of claim 1, wherein the light-side conductive layer comprises PEDOT:PSS (poly (3,4-ethylenedioxythiophene):poly (styrenesulfonate)).

5. The lead-free photodetector of claim 1, wherein the rear-side electrode comprises silver (Ag).

6. A method for manufacturing a lead-free photodetector, the method comprising:
    a first step of disposing a light-side conductive layer on a light-side electrode;
    a second step of disposing a perovskite layer on the light-side conductive layer;
    a third step of disposing a rear-side conductive layer on the perovskite layer; and
    a fourth step of disposing a rear-side electrode on the rear-side conductive layer,
    wherein the perovskite layer contains $PEA_xFA_{1-x}SnI_3$:
    where PEA is phenethylammonium, FA is formamidinium, and the x is a positive real number equal to or smaller than 1, and
    wherein the rear-side conductive layer comprises EDA, $PC_{61}BM$, $C_{60}$, and BCP.

7. The method of claim 6, wherein the x is between 0.1 to 0.2.

8. The method of claim 6, wherein the light-side electrode contains comprises indium tin oxide (ITO).

9. The method of claim 6, wherein the light-side conductive layer comprises PEDOT:PSS.

10. The method of claim 6,
    wherein the third step is performed by disposing a layer comprising the EDA on the perovskite layer, disposing a layer comprising the $PC_{61}BM$ on the layer comprising the EDA, disposing a layer comprising the $C_{60}$ on the layer comprising the $PC_{61}BM$, and disposing a layer comprising the BCP on the layer comprising the $C_{60}$.

11. The method of claim 6, wherein the rear-side electrode comprises silver (Ag).

* * * * *